United States Patent [19]

Sahara et al.

[11] Patent Number: 4,794,569
[45] Date of Patent: Dec. 27, 1988

[54] SEMICONDUCTOR MEMORY HAVING A BARRIER TRANSISTOR BETWEEN A BIT LINE AND A SENSING AMPLIFIER

[75] Inventors: Hiroshi Sahara, Tokyo; Haruki Toda, Yokohama; Shigeo Ohshima, Tokyo, all of Japan

[73] Assignee: Kabushiki Kaisha Toshiba, Kawasaki, Japan

[21] Appl. No.: 863,190

[22] Filed: May 14, 1986

[30] Foreign Application Priority Data

May 28, 1985 [JP] Japan ................................. 60-114807

[51] Int. Cl.⁴ ............................................... G11C 7/00
[52] U.S. Cl. ..................................... 365/203; 365/205
[58] Field of Search ........................ 365/190, 203, 205

[56] References Cited

U.S. PATENT DOCUMENTS 4,138,740 2/1979 Itoh ...................................... 365/203
4,598,387 7/1986 Chuang et al. ....................... 365/205

FOREIGN PATENT DOCUMENTS 60-48073 10/1985 Japan .

Primary Examiner—James W. Moffitt
Attorney, Agent, or Firm—Oblon, Fisher, Spivak, McClelland & Maier

[57] ABSTRACT

In this invention, in a sensing circuit of a dynamic memory, barrier transistors are provided between the bit lines and the sensing amplifier. A circuit is provided that, on sensing and on data transfer, changes the gate potential of the barrier transistors so that during the sensing operation the barrier transistors are temporarily turned OFF, so that sensing can be carried out with high sensitivity, as the sensing system is not affected by the parasitic capacitance of the bit lines, while, on data transfer to the input/output lines, the gate potential of the barrier transistors is raised to a level greater than a value reached by adding the threshold value of the MOS transistors to the power source voltage, so that the conductance of the barrier transistors is increased, thereby speeding up the presensing of the input/output lines in the sensing circuit.

4 Claims, 5 Drawing Sheets

SEMICONDUCTOR MEMORY HAVING A BARRIER TRANSISTOR BETWEEN A BIT LINE AND A SENSING AMPLIFIER

BACKGROUND OF THE INVENTION

1. Field of the Invention

This invention is concerned with a dynamic semiconductor memory, and in particular relates to the use of dynamic RAM (Random Access Memory) sensing circuits.

2. Description of the Prior Art

In conventional dynamic memory (RAM) sensing circuits, as shown in FIG. 1, an arrangement is used in which barrier transistors are provided between the bit lines and sensing amplifiers. In the Figure, BL and $\overline{BL}$ are paired bit lines which are respectively connected to flip-flop nodes FF and $\overline{FF}$ of sensing amplifiers through barrier transistors 1 and 2. I/O and $\overline{I/O}$ are paired input-/output lines constituting the data transfer nodes to the data input buffer and data output buffer, $\phi_{S1}$ and $\phi_{S2}$ are clocks for pre-sensing and main sensing respectively, $\phi_C$ is the column select line signal and $\phi_p$ is a precharged signal for a node $\phi_{SA}$. FIG. 2 shows a prior art example of a circuit for generating a gate control signal $\phi_T$ of barrier transistors 1 and 2. FIGS. 3(a), (b), (c) and (d) are charts showing the timing of the control clocks and the variation with time of the voltages at the various nodes. At first, as shown in FIG. 3(a) and FIG. 3(c), when the precharged signal $\phi_p$ is applied to the transistor 9, the node $\phi_{SA}$ is coupled to $V_{DD}$ potential through the transistor 9, so that node $\phi_{SA}$ is charged up to $V_{DD}-V_{TH}$.

As shown in FIG. 3(b), before the sensing operation is commenced, signal $\phi_T$ is at a level greater than "$V_{DD}+V_{TH}$", representing MOS transistor threshold voltage $V_{TH}$ added to power source voltage $V_{DD}$, allowing read data on bit lines BL, $\overline{BL}$ to be transferred to respective nodes FF, $\overline{FF}$. As shown in FIG. 3(c) and (d), bit line BL and node FF are then at potential $V_{DD}$ and bit line $\overline{BL}$ and node $\overline{FF}$ are a little lower than potential $V_{DD}$. When the sensing operation is performed, as shown in FIG. 1 and FIG. 3(a), transistors 5 and 6 are turned ON by the rising edges of $\phi_{S1}$ and $\phi_{S2}$ and the potential of node $\phi_{SA}$ is thereby lowered. Thanks to the coupling with capacitance 11 shown in FIG. 2, potential $\phi_T$ is also temporarily lowered to a level below the pre-charge potential of the bit line, e.g. potential $V_{DD}$, as shown in FIG. 3(b). This results in transistors 1 and 2 shown in FIG. 1 being turned OFF, so the effect of the parasitic capacitance of the bit lines BL and $\overline{BL}$ can be excluded from the sensing system, enabling the sensing to be of high sensitivity. Subsequently, node N1 assumes a potential of greater than "$V_{DD}+V_{TH}$" because of the coupling with capacitance 12 shown in FIG. 2, thereby turning transistor 10 ON. This results in signal $\phi_T$ recovering to source voltage $V_{DD}$, and the lower bit line $\overline{BL}$ being connected to earth potential $V_{SS}$ through transistors 2, 4, 5 and 6.

Next, when data is transferred to the input/output lines, as shown in FIG. 1 and FIG. 3(a), the selected signal $\phi_C$ assumes a potential greater than "$V_{DD}+V_{TH}$", and transistors 7 and 8 are turned ON, so that the I/O lines, which have already been charged up to potential $V_{DD}$, and the bit lines, are put into a conductive condition. Input/output line I/O connected to the higher bit line BL, which is at $V_{DD}$ level, maintains $V_{DD}$ level, while the level of input/output line $\overline{I/O}$ connected to the lower bit line $\overline{BL}$ falls, since the charge holding in the input/output lines is redistributed between the parasitic capacitance of the input/output lines and the parasitic capacitance of the bit lines. To further increase the potential difference which this charge redistribution produces between the input/output lines, the input/output lines are presensed by connecting the lower input/output line $\overline{I/O}$ to $V_{SS}$ potential through transistors 8, 2, 4, 5 and 6 using the sensing circuit.

However, in the conventional circuit, as shown in FIG. 3(b), the signal $\phi_T$ at this point is $V_{DD}$ level, so the conductance of transistor 2 is low, so that input/output line $\overline{I/O}$ discharges only slowly. Since the input/output line presensing operation in this sensing circuit occurs at a slow rate the timing of the rise of the signal $\phi_I$ that starts the main input/output line sensing operation in this input/output line sensing circuit has to be delayed, as shown in FIG. 3(a). Thus data can not be transferred at high speed.

SUMMARY OF THE INVENTION

In dynamic memory sensing circuits it is required not only to obtain high sensitivity of the sensing operation to increase the operating margin, but also to speed up data transfer to the data transfer nodes in order to provide high-speed access. In a memory provided with barrier transistors between sensing amplifiers and bit lines used with the purpose of improving the sensitivity of the sensing operation, the object of this invention is to make possible an improvement in the speed of data transfer, which has to be sacrificed in the prior art.

In a dynamic memory sensing circuit provided with barrier transistors between the bit lines and sensing amplifiers, this invention provides a circuit that makes the gate potentials of the barrier transistors change with the sensing time and data transfer time, so that, during the sensing operation, the barrier transistors are temporarily turned OFF, thus ensuring that the sensing system is not affected by the parasitic capacitance of the bit lines, and the sensing sensitivity is therefore high, while, on data transfer to the input/output lines, it raises the gate potential of the barrier transistor to a value greater than the threshold voltage of the MOS transistor added to the power source voltage, thus increasing the conductance of the barrier transistors so that presensing of the input/output lines by the sensing circuit can be speeded up.

DESCRIPTION OF THE PREFERRED EMBODIMENTS

Figure 4:
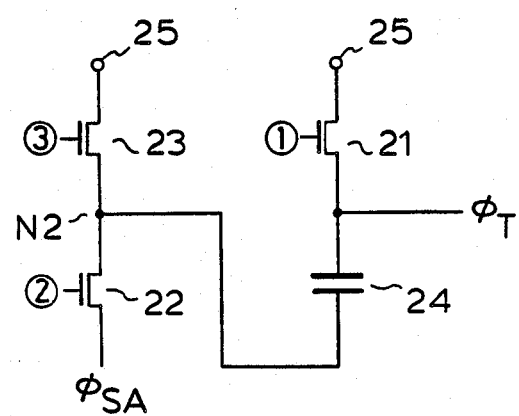
FIG. 4 is a circuit diagram of main parts of an embodiment of this invention connected to the aforementioned circuit.

Embodiments of this invention are described below with reference to the drawings. The sensing circuit itself in these embodiments is the same as in FIG. 1. An example of a barrier transistor gate potential generating circuit is shown in FIG. 4. As shown in these Figures, this circuit comprises a MOS transistor 21, MOS transistor 22 and MOS transistor 23. MOS transistor 21 connects a power source terminal 25 and a node $\phi_T$ constituting the gate input of transistors 1 and 2. MOS transistor 22 connects a node N2 and a node $\phi_{SA}$. Node N2 is connected by means of a capacitance 24 to node $\phi_T$, and node $\phi_{SA}$ is common to transistors 3 and 4 forming the flip-flop of the sensing amplifiers. MOS transistor 23 connects node N2 and power source terminal 25. Circuits for ensuring that the voltages of these nodes change as shown in FIG. 5(e) is connected to nodes ①, ② and ③.

Before the operation of the sensing circuit is commenced, as shown in FIG. 5(b), gate control signal $\phi_T$ of the barrier transistors is at a potential greater than "$V_{DD}+V_{TH}$", and node $\phi_{SA}$ is at level "$V_{DD}-V_{TH}$". As shown in FIG. 4 and FIG. 5(e), node ① is at level $V_{DD}$ and transistor 21 is OFF. Node ② is also at level $V_{DD}$, node N2 is charged to a potential greater than "$V_{DD}+V_{TH}$", and transistor 22 is in the cut-off state. Node N2 is then charged up to a potential greater than "$V_{DD}+V_{TH}$" as follows. Specifically, transistor 23 is turned ON so that node N2 is charged up to "$V_{DD}-V_{TH}$". After this, as bit lines BL and $\overline{BL}$ are recharged, node $\phi_T$ is raised to a potential greater than "$V_{DD}+V_{TH}$" by the coupling capacitances which are parasitic on transistors 1 and 2. Node N2 is then raised to a potential greater than "$V_{DD}+V_{TH}$" by a capacitance 24 shown in FIG. 4. As shown in FIG. 5(e), node ③ is at level $V_{SS}$, so transistor 23 is OFF.

Figure 1:
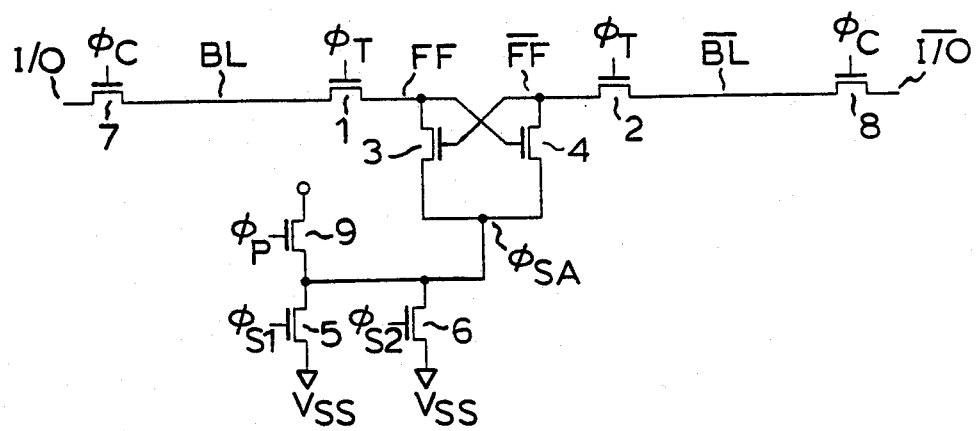
FIG. 1 is a circuit diagram of a sensing circuit provided with barrier transistors.
Figure 2:
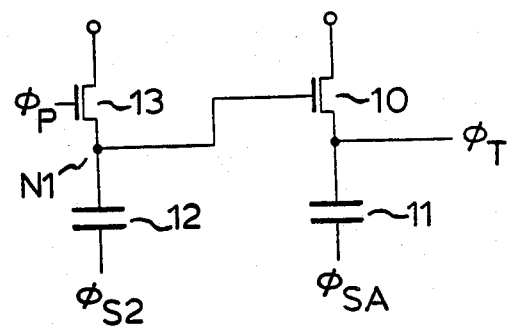
FIG. 2 is a circuit diagram of a transistor drive signal generating circuit in the conventional system.

During sensing operation, as node $\phi_{SA}$ falls in potential as shown in FIG. 5(c), transistor 22 shown in FIG. 4 is turned ON causing the potential of node N2 to drop too. Due to the coupling with capacitance 24, potential $\phi_T$ also temporarily drops, as shown in FIG. 5(b), to a level below the precharging potential of the bit lines. And node ① is made to assume a potential greater than "$V_{DD}+V_{TH}$", signal $\phi_T$ therefore recovers through transistor 21 to level $V_{DD}$. As shown in FIG. 1, transistors 1 and 2 are turned OFF by the drop in the potential of $\phi_T$, so sensing can be performed with great sensitivity. At the time-point when the sensing operation is completed and the potential of $\phi_{SA}$ has fallen to level $V_{SS}$, as shown in FIG. 5(e), node ② is made to assume potential $V_{SS}$, thus turning transistor 22 OFF.

On data transfer to the input/output lines, as shown in FIGS. 5(a) and 5(e), the potential of node ① is made to fall, with the timing of the rising edge of signal $\phi_C$, from a level greater than "$V_{DD}+V_{TH}$" to level $V_{DD}$ thereby turning OFF transistor 21 and then raising the potential of node ③, so that node N2 is again charged through transistor 23. As the potential of node N2 rises as shown in FIG. 5(b), due to the coupling with capacitance 24, signal $\phi_T$ rises to a potential greater than "$V_{DD}+V_{TH}$".

Figure 5:
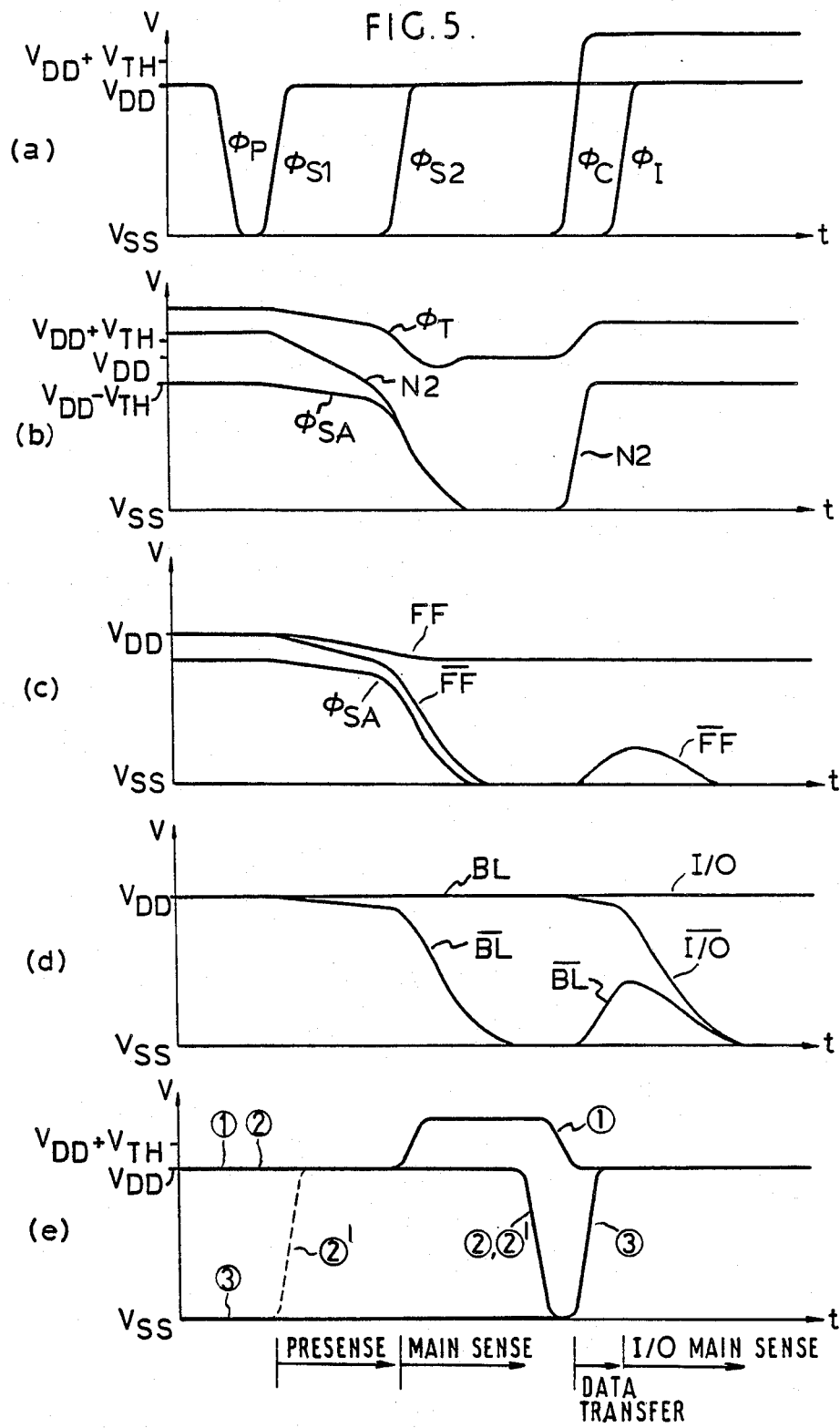
FIGS. 5a-5e are signal waveforms showing the operation of the aforementioned embodiment of this invention.
Figure 6:
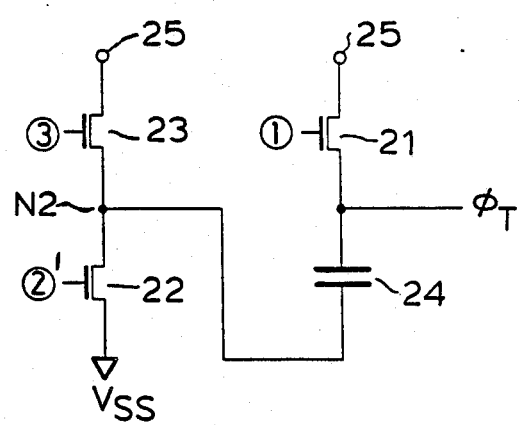
FIG. 6 is a circuit diagram of main parts of another embodiment of this invention.

FIG. 6 shows an example in which the source of transistor 22 of FIG. 4 is connected to earth potential $V_{SS}$ instead of node $\phi_{SA}$. The gate potential ②' of transistor 22, which, before sensing, was at level $V_{SS}$ as shown in FIG. 5(e), rises during sensing operation to level $V_{DD}$, and after sensing is completed falls again to level $V_{SS}$.

Figure 3:
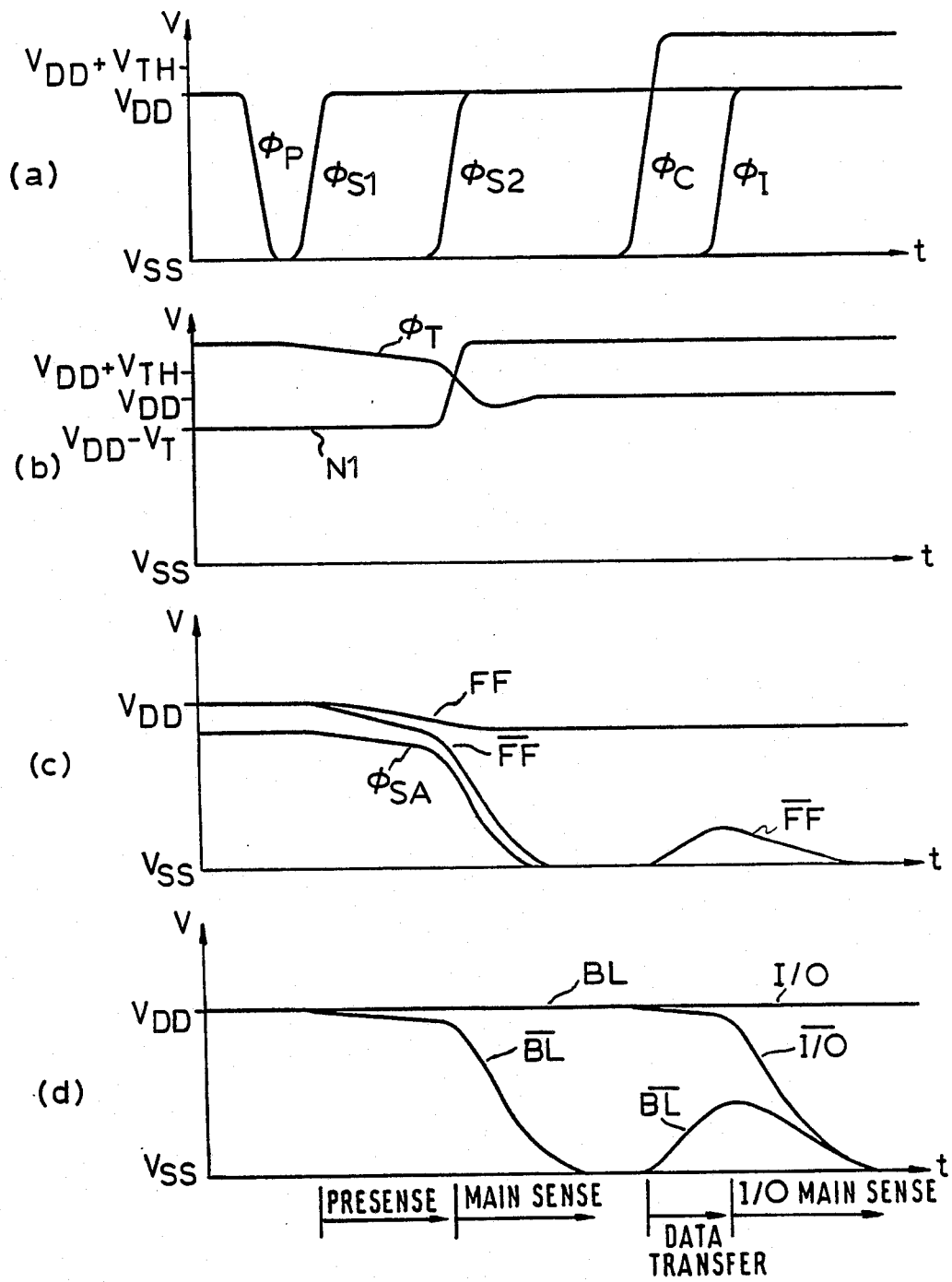
FIGS. 3a-3d are signal waveforms showing the operation of the sensing circuit of the conventional system.

As can be seen by inspection of the waveforms of the conventional system of FIG. 3 and the embodiment of this invention shown in FIG. 5. Whereas, with the conventional system, the potential of signal $\phi_T$ on data transfer to the input/output lines is $V_{DD}$, with this embodiment of the invention, it is at least at level "$V_{DD}+V_{TH}$". Thus the conductance of the barrier transistors is large and voltage drop of the lower I/O line occurs quickly. That is, the rise in $\phi_I$ of FIG. 5(a) and the fall of nodes $\overline{FF}$, $\overline{I/O}$, and $\overline{BL}$ of FIG. 5(c) and (d) occurs quickly. Consequently, by using the circuit of this invention, the necessary increase in speed of data transfer can be attained thanks to a speeding up of the operation of pre-sensing the I/O lines in the sensing circuit. In contrast, with the conventional system, speeding up of the operation of pre-sensing the I/O lines in the sensing circuit was sacrificed.

As described above, according to this invention, in a dynamic memory wherein barrier transistors are provided between the sensing amplifier and bit lines used in order to purpose at increased sensitivity of the sensing operation, increased speed of data transfer (which was sacrificed in the prior art) can be obtained.

What is claimed is:

1. Semiconductor memory supplied with a power source voltage and an earth potential, comprising:
   a first MOS transistor connected between a bit line having a precharging level and a sensing circuit of a dynamic memory;
   means for lowering the gate potential of said MOS transistor to a level below the precharging level of said bit line during the sensing operation, and for raising said gate potential, on data transfer, to a level greater than a value reached by adding the threshold voltage of the MOS transistor to the power source voltage.

2. Semiconductor memory according to claim 1, further comprising:
   a second MOS transistor that connects a power source supplying said power source voltage and a first node constituting the gate input of said first MOS transistor;
   a third MOS transistor that connects a second node which is common to a pair of MOS transistors constituting a flip-flop of said sensing circuit and a third node connected through a capacitance with said first node; and
   a fourth MOS transistor that connects said third node and said power source;
   so that said third node discharges through said third MOS transistor on sensing operation, and on data transfer operation recharges through said fourth MOS transistor, whereby, due to the coupling with said capacitance, the potential of said first node falls to a level below the precharging potential of said bit line during sensing operation and during data transfer operation rises to a level reached by adding the threshold voltage of said first MOS transistor to the power source voltage.

3. Semiconductor memory according to claim 1, further comprising:
   a second MOS transistor that connects a power source supplying said power source voltage and a first node constituting the gate input of said first MOS transistor;

a third MOS transistor that connects said earth potential and a second node connected through a capacitance with said first node; and a fourth MOS transistor that connects said second node and said power source;

so that said second node discharges through said third MOS transistor on sensing operation, and on data transfer operation recharges through said fourth MOS transistor, whereby, due to the coupling with said capacitance, the potential of said first node falls to a level below the precharging potential of said bit line during sensing operation and during data transfer operation rises to a level reached by adding the threshold voltage of said first MOS transistor to the power source voltage.

4. Semiconductor memory supplied with a power source voltage and an earth potential, comprising:

an MOS transistor connected between a bit line having a precharging level and a sensing circuit of a dynamic memory; and means for lowering the gate potential of said MOS transistor to a level below the precharging level of said bit line during a sensing operation, and for raising said gate potential, on data transfers, to a level greater than a value rached by adding the threshold voltage of the MOS transistor to the precharging level of the bit line.

* * * * *